(12) United States Patent
Chiang (10) Patent No.: US 7,638,875 B2
(45) Date of Patent: Dec. 29, 2009

(54) PACKAGING STRUCTURE

(75) Inventor: Chia-Wen Chiang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 139 days.

(21) Appl. No.: 11/733,783

(22) Filed: Apr. 11, 2007

(65) Prior Publication Data

US 2008/0061427 A1   Mar. 13, 2008

(30) Foreign Application Priority Data

Sep. 11, 2006   (TW) .............................. 95133410 A (51) Int. Cl.
*H01L 23/12*       (2006.01)
(52) U.S. Cl. ............... 257/724; 257/700; 257/E23.063
(58) Field of Classification Search .............. 257/678, 257/698, E29.169, 686, 700, 724, 777, E23.063
See application file for complete search history.

(56) References Cited

U.S. PATENT DOCUMENTS

| | | | |
|---|---|---|---|
| 5,530,288 A | 6/1996 | Stone | |
| 6,274,937 B1 | 8/2001 | Ahn et al. | |
| 6,500,724 B1 | 12/2002 | Zurcher et al. | |
| 6,611,419 B1 | 8/2003 | Chakravorty | |
| 6,614,106 B2 | 9/2003 | Matsuo et al. | |
| 6,661,088 B1 | 12/2003 | Yoda et al. | |
| 6,819,001 B2 | 11/2004 | Burdick, Jr. et al. | |
| 6,933,601 B2 | 8/2005 | Satoh et al. | |
| 7,355,290 B2 * | 4/2008 | Shioga et al. | ............... 257/790 |
| 2002/0123159 A1 * | 9/2002 | Chi et al. | ......................... 438/3 |
| 2006/0291177 A1 * | 12/2006 | Choi et al. | .................. 361/780 |
| 2008/0134499 A1 * | 6/2008 | Shioga et al. | .................. 29/830 |

* cited by examiner

*Primary Examiner*—Victor Mandala
*Assistant Examiner*—Scott Stowe
(74) *Attorney, Agent, or Firm*—Jianq Chyun IP Office (57) ABSTRACT

A packaging structure including an interposer structure, a first electronic component, and a second electronic component is provided. The interposer structure includes a first dielectric layer, a plurality of contacts, a capacitive element, and an interconnection. The contacts are disposed on the upper and lower surfaces of the first dielectric layer and the capacitive element, which comprises two conductive layers and a second dielectric layer located among the layers, is embedded into the first dielectric layer. And the interconnection is embedded into the first dielectric layer, while the capacitive element electrically connects to the corresponding contacts through the interconnection. The first and the second electronic components are disposed respectively on the upper and bottom sides of the interposer structure and electrically connected to the corresponding contacts.

12 Claims, 14 Drawing Sheets

PACKAGING STRUCTURE

CROSS-REFERENCE TO RELATED APPLICATION

This application claims the priority benefit of Taiwan application serial no. 95133410, filed Sep. 11, 2006. All disclosure of the Taiwan application is incorporated herein by reference.

BACKGROUND OF THE INVENTION

1. Field of the Invention

The present invention relates to a semiconductor device and a manufacturing method thereof. More particularly, the present invention relates to a packaging structure and a manufacturing method thereof.

2. Description of Related Art

The technology of stacking chips can shorten the transmission pathway of electronic signals and provide an efficient technique to integrate different material chips. In terms of the latter, it can stack up the high-frequency power amplifier chips and radio frequency chips, or can be integrated with the micro-electro mechanical system devices. Moreover, the overall performance of the stacked-chip packaging structure can be improved if the passive elements can be integrated effectively. Therefore, it is essential to provide a high quality and highly integrated interposer structure with passive elements between the stacked chips.

Figure 1:
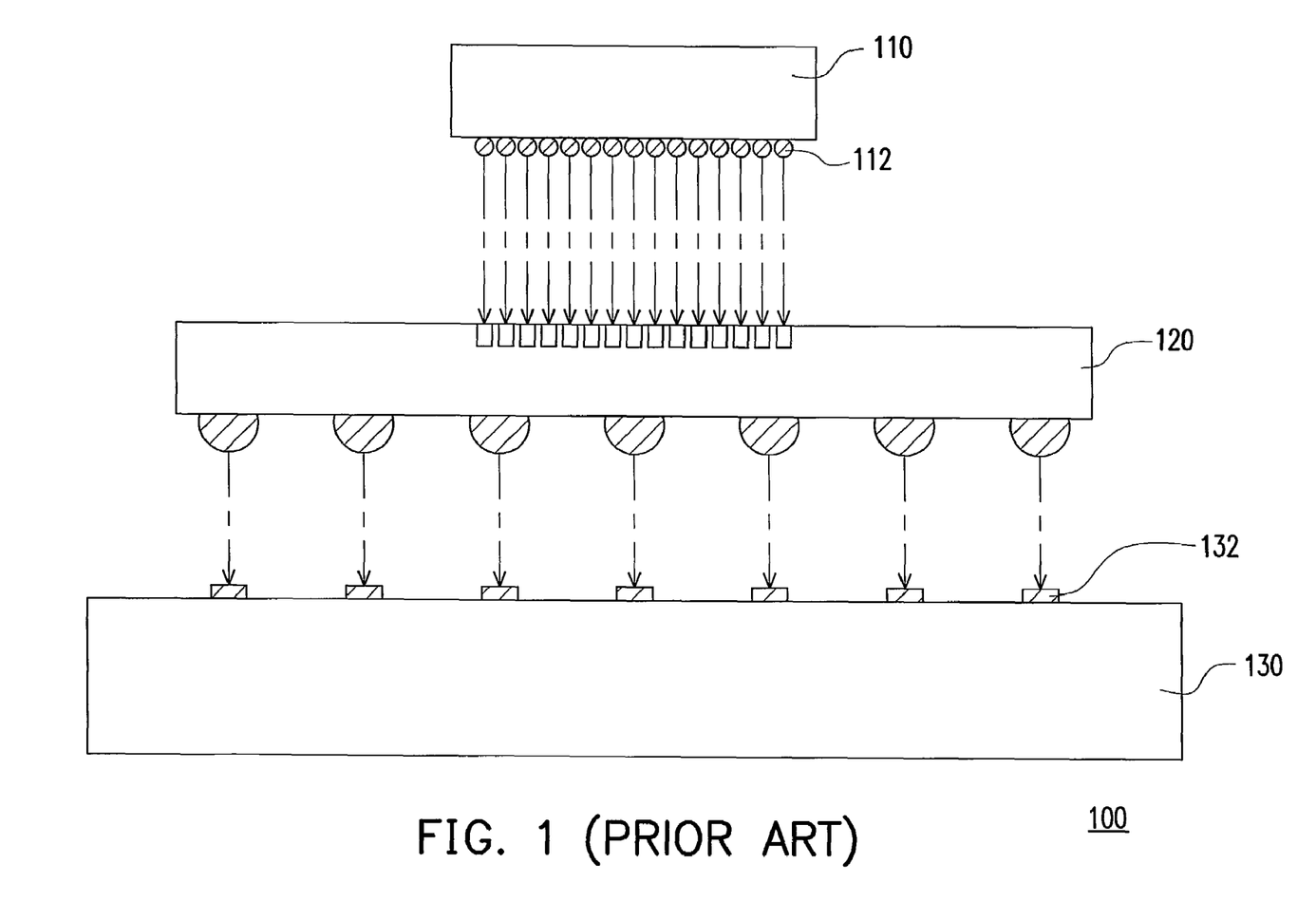
FIG. 1 is a schematic view of a conventional stacked circuit device.

Referring to FIG. 1, it is a schematic view of a conventional stacked circuit device. The conventional stacked circuit device 100 is disclosed in U.S. Pat. No. 6,661,088, wherein it includes a chip 110, an interposer structure 120 and a substrate 130. A plurality of pads 112 disposed on the chip 110 is electrically connected to the corresponding multiple pads 132 disposed on the substrate 130 through the interposer structure 120. The main purpose of the interposer structure 120 is to serve as circuit redistribution.

Figure 2:
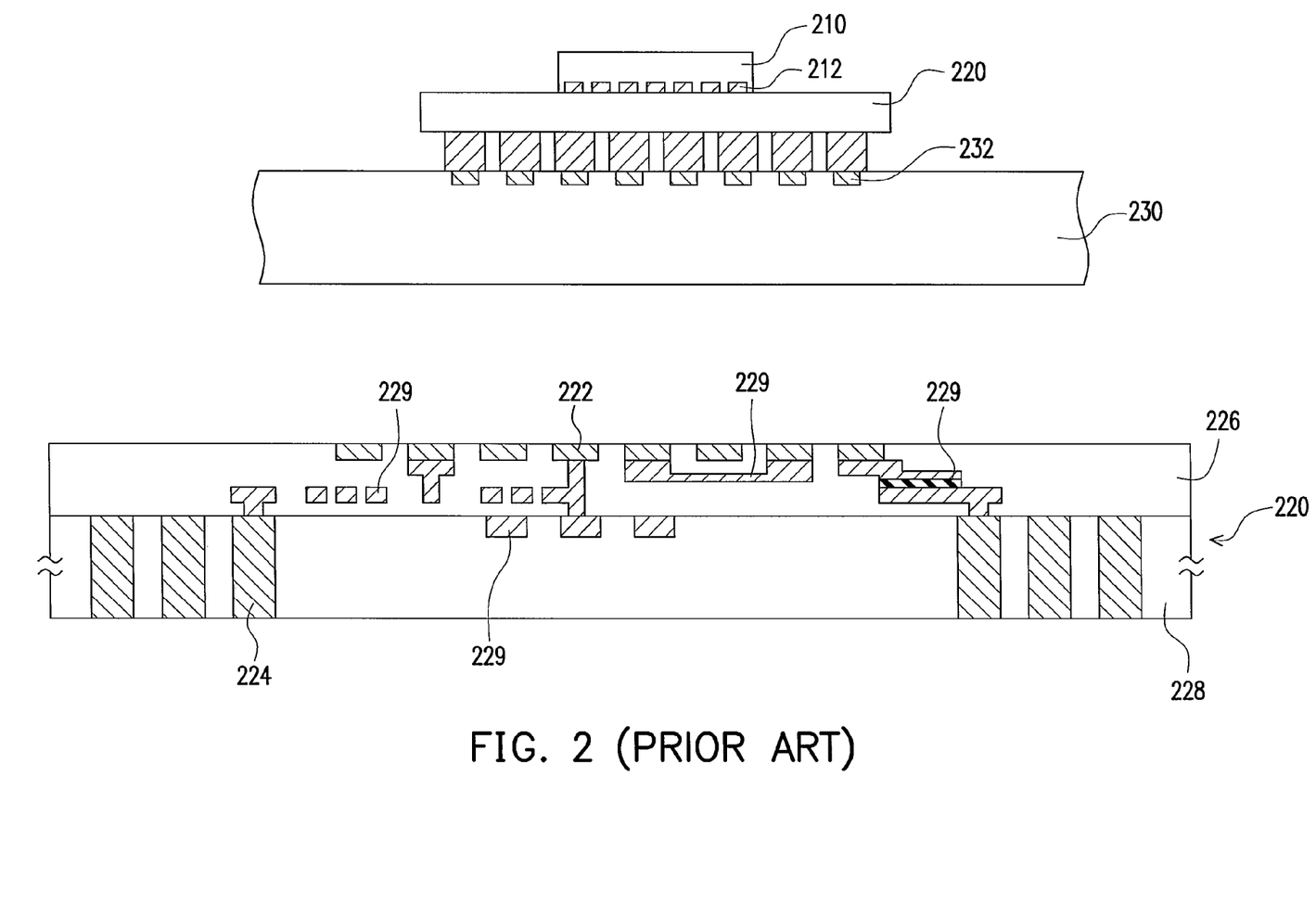
FIG. 2 is a schematic view of another conventional stacked circuit device.

Another conventional stacked circuit device is provided for the purpose of integrating different type circuit elements such as active elements and passive elements to the interposer structure. Referring to FIG. 2, it is a schematic view of another conventional stacked circuit device. The conventional stacked circuit device 200 disclosed in U.S. Pat. No. 6,614,106 includes a chip 210, an interposer structure 220 and a base substrate 230. It should be noted that for the sake of clarified description, FIG. 2 also shows the enlarged view of the interposer structure 220. A plurality of terminals 212 of the chip 210 are electrically connected to the corresponding multiple terminals 222 of the interposer structure 220. Whereas the other terminals 224 of the interposer structure 220 are electrically connected to the set of terminals of the base substrate 230. The interposer structure 220 comprises an insulating film 226, a semiconductor substrate 228, and a plurality of circuit elements 229 such as the active and passive elements which are disposed in the insulating film 222.

Other related techniques of fabricating passive elements on the semiconductor base material of the interposer structure are disclosed in U.S. Pat. Nos. 6,500,724, 6,819,001 and 6,274,937. However, fabricating passive elements on the semiconductor base material may leads to low quality factor of inductive elements, inferior capacitance due to the limitations of material and processing temperature of semiconductor, and poor resistance of the resistive elements.

To overcome the aforementioned drawbacks, the method of fabricating passive elements on the insulating materials, ceramic or plastic, of the interposer structure are proposed and the related techniques are described in the U.S. Pat. Nos. 6,933,601, 6,611,419 and 5,530,288. However, it often cost much since to fabricate inductive elements on ceramic base substrate, the high priced material, silver, is often used. On the other hand, the quality factor of the inductive elements is decreased while adopting epoxy resin as the dielectric material to fabricate the inductive element on a plastic substrate. In addition, it may cause poor capacitance when fabricating capacitive elements on the insulating substrate, less process compatibility when manufacturing resistive elements on the ceramic substrate, and unstable resistance when forming the resistive elements on the plastic substrate. Also, it may cause the final product of the interposer structure big and thick when fabricating passive elements on the insulating base materials.

SUMMARY OF THE INVENTION

The present invention provides a packaging structure, wherein the interposer structure has better quality passive elements and is in a thinner and smaller size.

The present invention also provides a manufacturing method of the packaging structure, which is compatible with the conventional fabricating process and has lower cost.

As embodied and broadly described herein, the present invention is directed to a packaging structure, which includes an interposer structure, a first electronic component and a second electronic component. The interposer structure includes a first dielectric layer, a plurality of contacts, a capacitive element and an interconnection. The contacts are disposed on the upper and lower surfaces of the first dielectric layer and the capacitive element, which comprises two conductive layers and a second dielectric layer among them, is embedded into the first dielectric layer. The interconnection is embedded into the first dielectric layer and the capacitive element electrically connects to the corresponding contacts through the interconnection. The first electronic component and the second electronic component are electrically connected to the contacts and respectively disposed on the upper and lower sides of the interposer structure.

According to an embodiment of the present invention, the permittivity of the aforementioned first dielectric layer is smaller than that of the second dielectric layer.

According to an embodiment of the present invention, the packaging structure further comprises an inductive element embedded into the first dielectric layer. Further, the inductive element may be disposed surrounding the capacitive element.

According to an embodiment of the present invention, the capacitive element further includes a barrier layer, which is disposed between one of the conductive layers and the second dielectric layer. In addition, the material of the barrier layer may be titanium (Ti), platinum (Pt), or silver (Ag).

According to an embodiment of the present invention, the material of the second dielectric layer includes ceramic, such as barium titanate (BaTiO3) or strontium titanate (SrTiO3).

According to an embodiment of the present invention, the material of the first dielectric layer includes benzocyclobutene (BCB) or polyimide (PI).

According to an embodiment of the present invention, the interposer structure further includes a resistive module, which is embedded into the first dielectric layer and stacked up with the capacitive element, and the resistive module is electrically connected to the corresponding contacts through the interconnection.

According to an embodiment of the present invention, the resistive module comprises a substrate and a resistive thin film disposed on the substrate and electrically connects to the interconnection. In addition, the resistive module may further comprise a plurality of electrodes, which are disposed on the substrate and the resistive thin film is connected to the interconnection through the electrodes; and a passivation layer, which is disposed on the substrate and covers the resistive thin film and the electrodes. Furthermore, the material of the substrate may be ceramic.

According to an embodiment of the present invention, the first electronic component is a semiconductor chip or a wafer.

According to an embodiment of the present invention, the second electronic component is a semiconductor chip or a wafer.

The present invention is also directed to a fabricating method of packaging structure, which comprises: forming a capacitive element; forming a first dielectric layer on a first electronic component by performing a build-up process, forming an interconnection in the first dielectric layer, and forming a plurality of contacts on the upper and lower surfaces of the first dielectric layer, wherein the capacitive element is embedded in the first dielectric layer during the fabrication of the interconnection and the capacitive element is electrically connected to the corresponding contacts through the interconnection; and, disposing a second electronic component on the first dielectric layer, wherein the second electronic component is electrically connected to the corresponding contacts.

According to an embodiment of the present invention, the capacitive element comprises two conductive layers and a second dielectric layer located among them, in which the permittivity of the first dielectric layer is smaller than that of the second dielectric layer.

According to an embodiment of the present invention, the fabricating method of the packaging structure further comprises forming an inductive element at the same time of fabricating the interconnection and the inductive element is electrically connected to the corresponding contacts through the interconnection. Further, the inductive element may be disposed surrounding the capacitive element.

According to an embodiment of the present invention, the steps of forming the capacitive element includes: providing a metal film; coating a dielectric material on the metal film; and, forming an electrode layer on the dielectric material. The dielectric material includes, for example, ceramic slurry.

In addition, the fabricating method of the packaging structure may further comprise performing a thermal treatment process to the dielectric material after coating the same.

The fabricating method of the packaging structure may further comprise forming a barrier layer on the metal film before coating the dielectric material.

According to an embodiment of the present invention, the finished capacitive element is trimmed into a certain size after the electrode layer is formed.

According to an embodiment of the present invention, the fabricating method of the packaging structure may further comprise performing an etching process to the capacitive element to define the surface area thereof after the capacitive element is embedded into the first dielectric layer.

According to an embodiment of the present invention, the fabricating method of the packaging structure further comprises providing a resistive module at the same time of fabricating the interconnection, and making the resistive module and the capacitive element stacked up with each other and to be embedded into the first dielectric layer, wherein the resistive module is electrically connected to the corresponding contacts through the interconnection.

The capacitive element and the aforementioned resistive module may be stacked up with each other first, and then being embedded into the first dielectric layer together.

Otherwise, the resistive module can be fabricated by: providing a substrate and forming a resistive thin film thereon. In addition, the steps of fabricating the resistive module may further include: forming a plurality of electrodes on the substrate, wherein the resistive thin film is electrically connected with the electrodes; and, forming a passivation layer on the substrate to cover the electrodes and the resistive thin film.

According to an embodiment of the present invention, the first electronic component is a semiconductor chip or a wafer.

According to an embodiment of the present invention, the second electronic component is a semiconductor chip or a wafer.

Accordingly, since the interposer structure of the present invention does not contain semiconductor substrate, therefore the interposer structure is thinner and smaller in size. In addition, because of the capacitive element is located closer to either the first electronic component or the second electronic component, the efficiency is improved when the capacitive element is served as a de-coupling capacitor. Furthermore, according to the method of fabricating packaging structure of the present invention, the capacitive element can be manufactured individually before being embedded into the first dielectric layer. Therefore, the fabricating method of packaging structure can be integrated with the conventional process and thus has lower cost.

In order to make the aforementioned and other objects, features and advantages of the present invention comprehensible, a preferred embodiment accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 3:
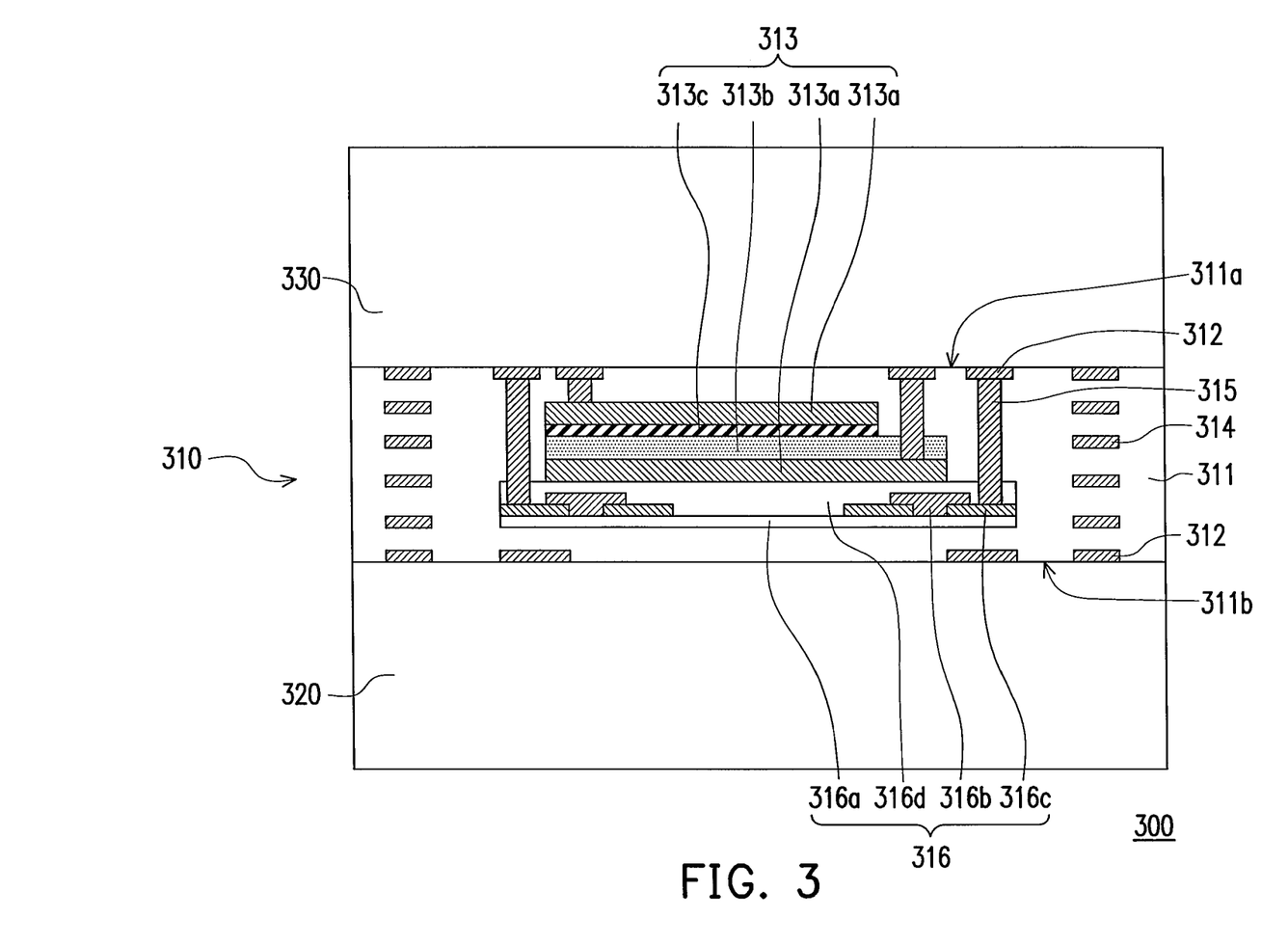
FIG. 3 is a schematic view showing a packaging structure according to an embodiment of the present invention.

Referring to FIG. 3, a cross sectional view showing a packaging structure according to an embodiment of the present invention is illustrated. A packaging structure 300 includes an interposer structure 310, a first electronic component 320 and a second electronic component 330, wherein the first electronic component 320 and a second electronic component 330 can be either semiconductor chip or wafer. The interposer structure 310 includes a first dielectric layer 311, a plurality of contacts 312, a capacitive element 313, an inductive element 314 and an interconnection 315. The contacts 312 are disposed on the upper surface 311a and lower surface 311b of the first dielectric layer 311. The capacitive element 313 is embedded into the first dielectric layer 311. And, the capacitive element 313 comprises two conductive layers 313a and a second dielectric layer 313b located between the conductive layers 313a. The inductive element 314 and the interconnection 315 are embedded into the first dielectric layer 311. The capacitive element 313 and the inductive element 314 are electrically connected to the corresponding contacts 312 through the interconnection 315. The first electronic component 320 and the second electronic component 330 are respectively disposed on the upper and lower sides of the interposer structure 310 and electrically connected to the corresponding contacts 312.

In the present embodiment, the permittivity of the first dielectric layer 311 is smaller than that of the second dielectric layer 313b. Since the permittivity of the second dielectric layer 313b of the capacitive element 313 is higher, a higher capacitance value of the capacitive element 313 can be attained. On the other hand, since the permittivity of the first dielectric layer 311 is lower, the parasitic capacitance of the inductive element 314 is lower and thus has a better Q-factor. When being as a decoupling capacitor, the efficiency of the capacitive element 313 can be improved by arranging the capacitive element 313 near by the first electronic component 320 and the second electronic component 330, according to the necessity of the design.

In the present embodiment, the spiral-like inductive element 314 can be disposed surrounding the capacitive element 313, resulting the high integration density of the passive element of the interposer structure 310, thus the interposer structure 310 is thinner and smaller in size. In addition, the capacitive element 313 further includes a barrier layer 313c, which is disposed between one of the conductive layers 313a and the second dielectric layer 313b. The material of the barrier layer 313c includes titanium (Ti), platinum (Pt), or silver (Ag). The barrier layer 313c can prevent the conductive layers 313a from reacting with the second dielectric layer 313b when fabricating the capacitive element 313. The material of the second dielectric layer 313b located at the capacitive element 313 includes ceramic, such as the ferroelectric materials of barium titanate (BaTiO3) or strontium titanate (SrTiO3); and the material of the first dielectric layer 311 includes benzocyclobutene (BCB) or polyimide (PI).

Referring to FIG. 3, the interposer structure 310 further includes a resistive module 316, which is embedded into the first dielectric layer 311 and stacked up with the capacitive element 313. According to the relative position shown in FIG. 3, the capacitive element 313 can be stacked up on the resistive module 316, and the resistive module 316 is electrically connected to the corresponding contacts 312 through the interconnection 315. The resistive module 316 includes a substrate 316a, which can be made of ceramic, and a resistive film 316b. The resistive film 316b is disposed on the substrate 316a and electrically connected to the interconnection 315. Moreover, the resistive module 316 includes a plurality of electrodes 316c and a passivation layer 316d. The electrodes 316c are disposed on the substrate 316a and the resistive film 316b is connected to the interconnection 315 via the electrodes 316c. The passivation layer 316d is disposed on the substrate 316a and covers the resistive film 316b and the electrodes 316c.

It should be noted that even though the interposer structure 310 of the above embodiment, comprises of the capacitive element 313, the inductive element 314 and resistive module 316 for an example. In another embodiment, the interposer structure 310 may only contain the capacitive element 313 for serving as de-coupling capacitors. Therefore, the efficiency of the capacitive element 313, which serves as a decoupling capacitor, can be improved by arranging the capacitive element 313 near by the first electronic component 320 and the second electronic component 330, according to the necessity of the design.

Figure 4:
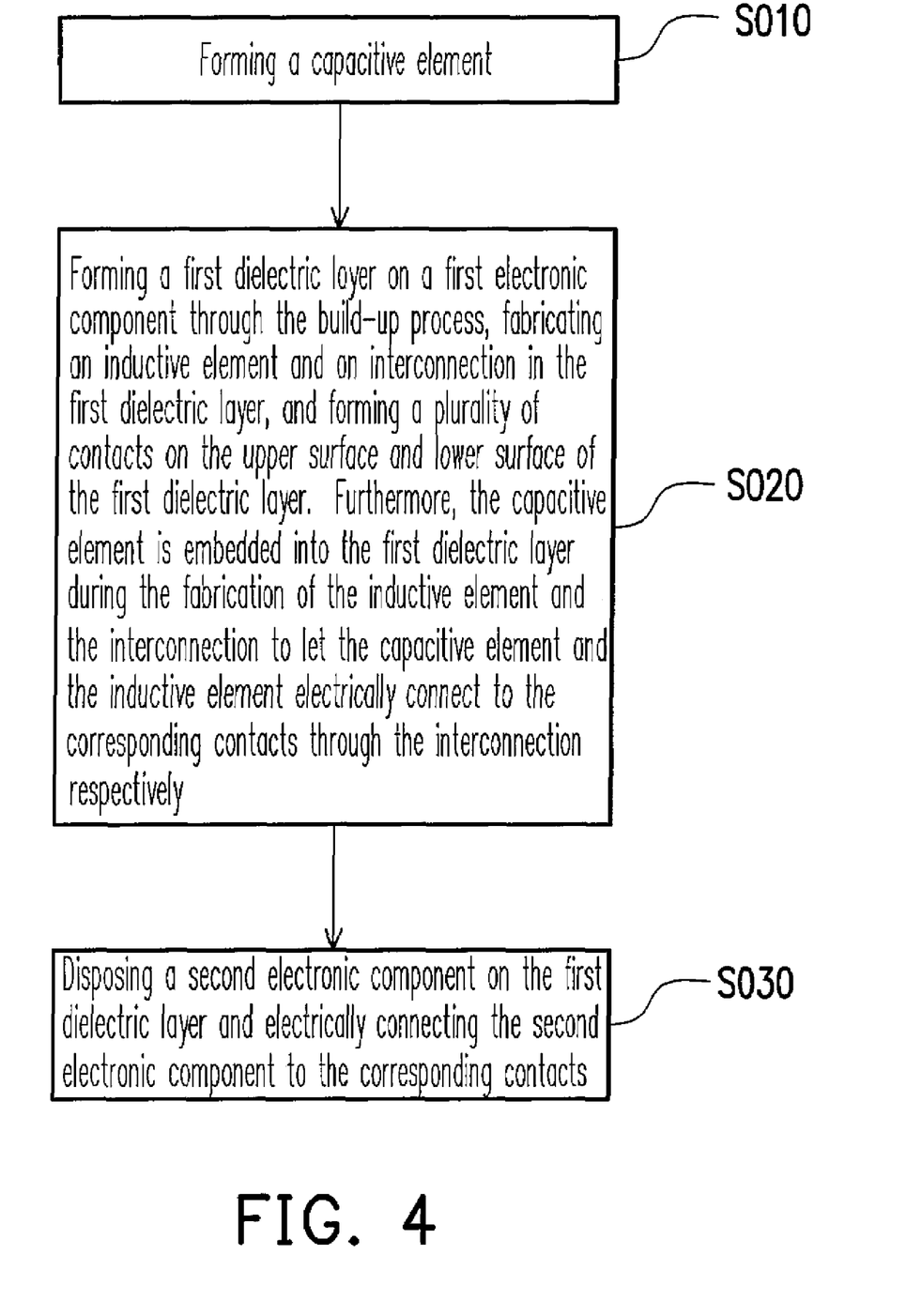
FIG. 4 is a flow chart showing the steps of fabricating a packaging structure according to an embodiment of the present invention.
Figure 5A:
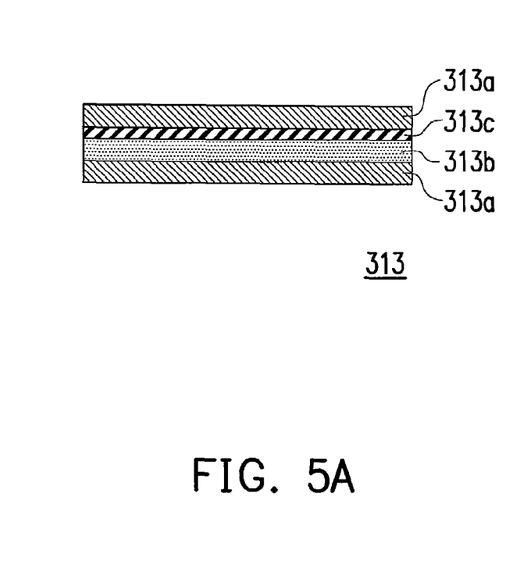
FIGS. 5A to 5C are cross-sectional views schematically illustrating the steps of fabricating a packaging structure according to an embodiment of the present invention.
Figure 5B:
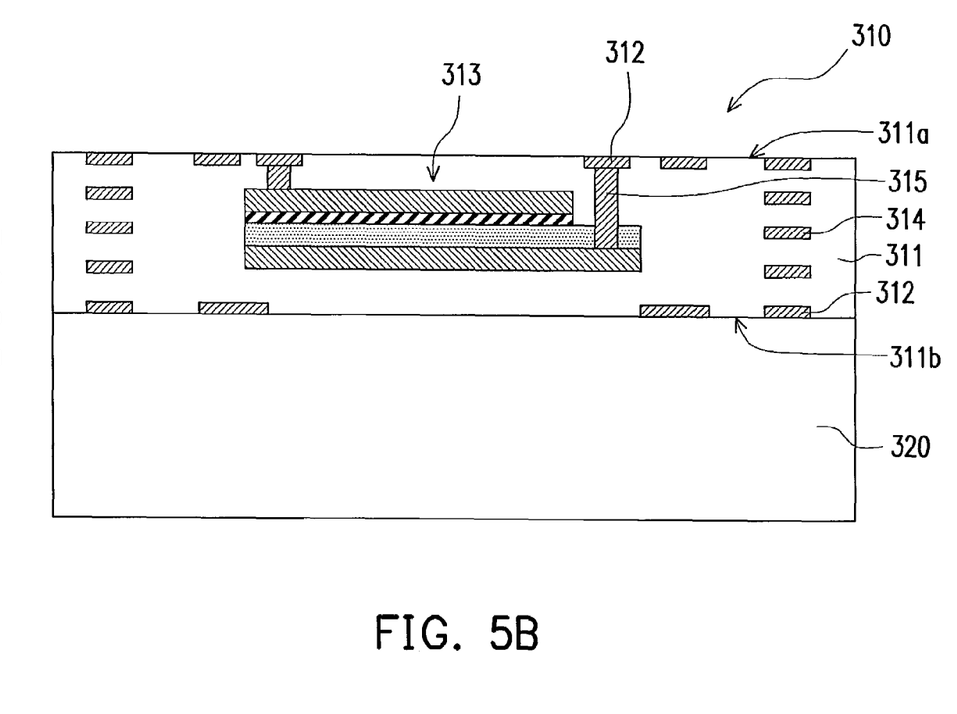
Figure 5C:
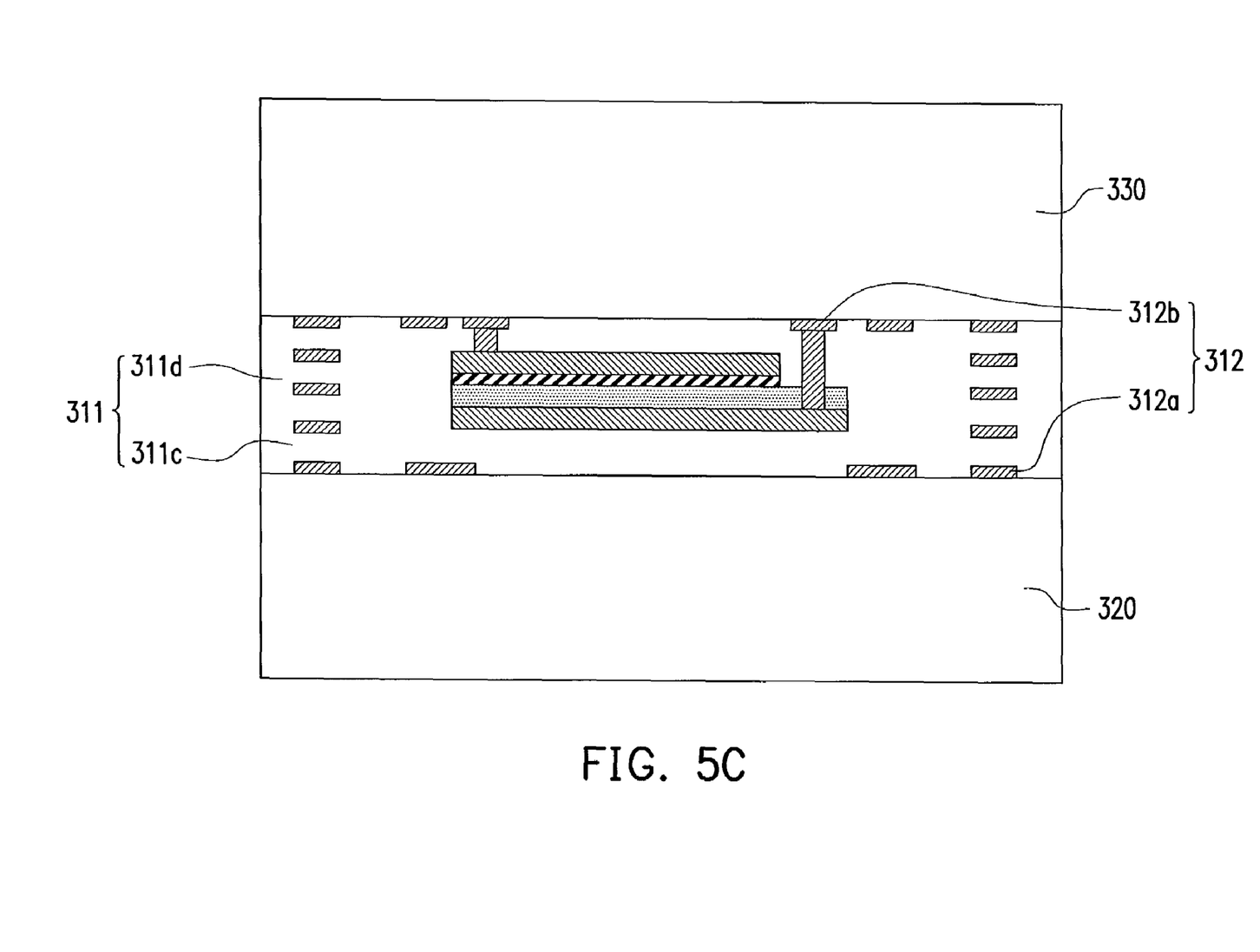

The following is a detailed description of a fabricating method of a packaging structure according to an embodiment of the present invention. FIG. 4 is a flow chart showing the steps of fabricating the packaging structure. FIGS. 5A to 5C are cross-sectional views schematically illustrating the steps of fabricating the packaging structure. The fabricating method of the packaging structure of the present embodiment includes the steps S010, S020 and S030. Referring to FIGS. 4 and 5A, first of all, the step S010 is carried out to form the capacitive element 313.

Figure 6A:
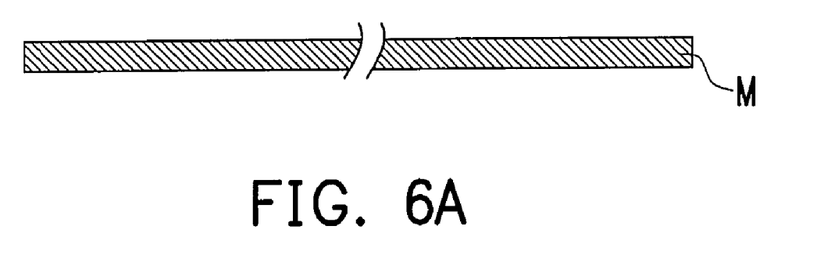
FIGS. 6A to 6F are cross-sectional views schematically showing a fabricating process of a capacitive element.
Figure 6B:
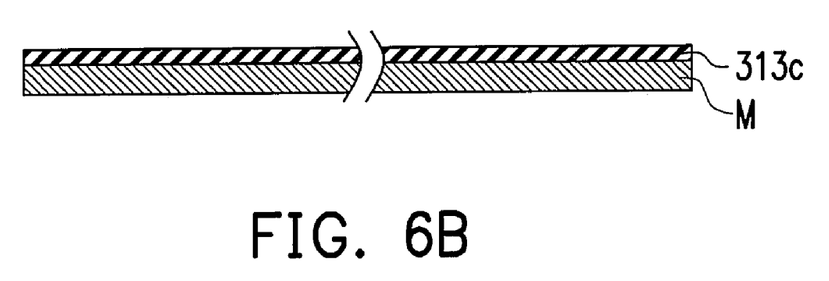
Figure 6C:
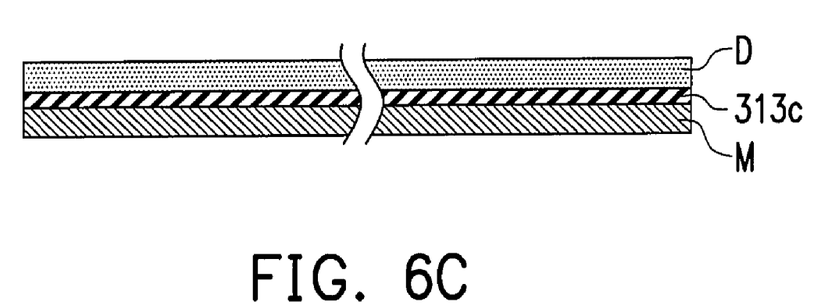
Figure 6D:
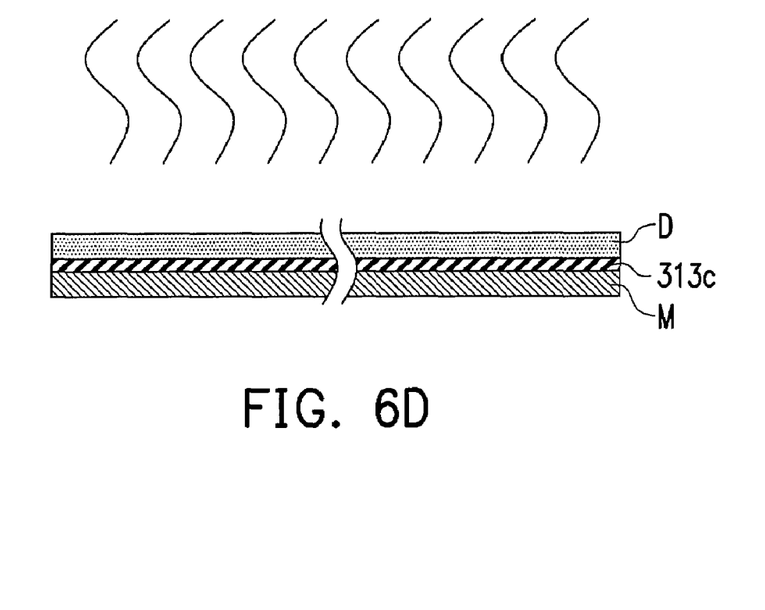
Figure 6E:
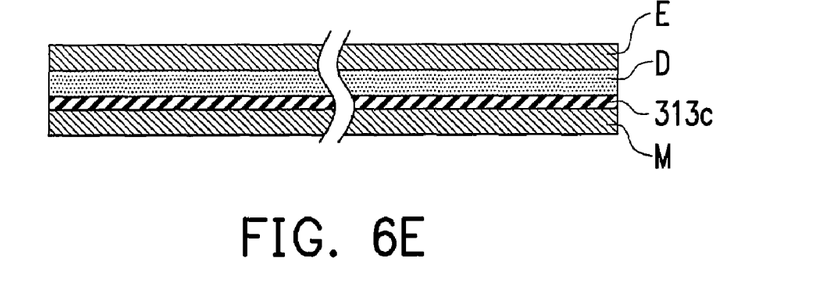
Figure 6F:
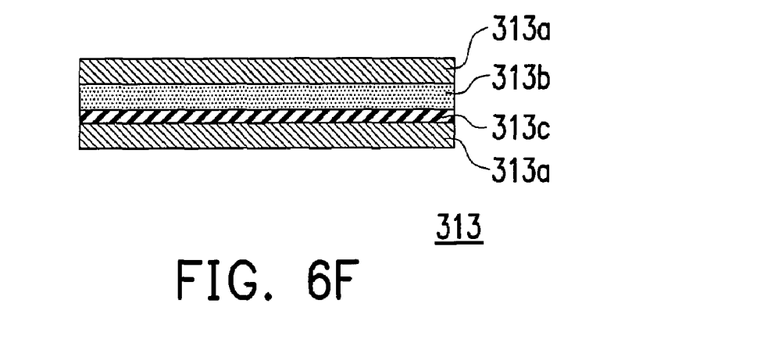

FIGS. 6A to 6F are cross-sectional views schematically showing a fabricating process of the capacitive element shown in FIG. 5A. The fabricating method of the capacitive element 313 includes the following sub-steps. First, referring to FIG. 6A, a metal film M is provided. Next, referring to FIG. 6B, a barrier layer 313c can be formed on the metal film M to prevent the reaction of the metal film M with the dielectric material D formed in the following steps and thus preserve the dielectric characteristic of the dielectric material D if the metal film M will react with the dielectric material D. Referring to FIG. 6C, a dielectric material D, such as a suspended ceramic slurry, is coated on the metal film M, wherein the ceramic slurry can be prepared from the nanometer ferroelectric material powder by performing the sol-gel method. Then, referring to FIG. 6D, the manufacturing process of, for example, a thermal treatment, such as annealing, is performed to the dielectric material D. Referring to FIG. 6E, an electrode layer E is formed on the dielectric material D to finish the basic manufacture of the capacitive element 313. After that, referring to the FIG. 6F, the finished capacitive element 313 can be trimmed into a certain size. Referring to FIG. 6F, the trimmed capacitive element 313 comprises two conductive layers 313a, a second dielectric layer 313b located among the conductive layers 313a, and a barrier layer 313c disposed between the second dielectric layer 313b and one of the conductive layers 313a.

Then, referring to FIGS. 4 and 5B, an interposer structure 310 is formed through the steps S020, wherein a first dielectric layer 311 is formed on a first electronic component 320 through the build-up process. An inductive element 314 and an interconnection 315 are fabricated in the first dielectric layer 311. In addition, a plurality of contacts 312 are formed on the upper surface 311a and lower surface 311b of the first dielectric layer 311. Furthermore, the capacitive element 313 is embedded into the first dielectric layer 311 during the fabrication of the inductive element 314 and the interconnection 315 to let the capacitive element 313 and the inductive element 314 electrically connect to the corresponding contacts 312 through the interconnection 315 respectively.

Figure 7A:
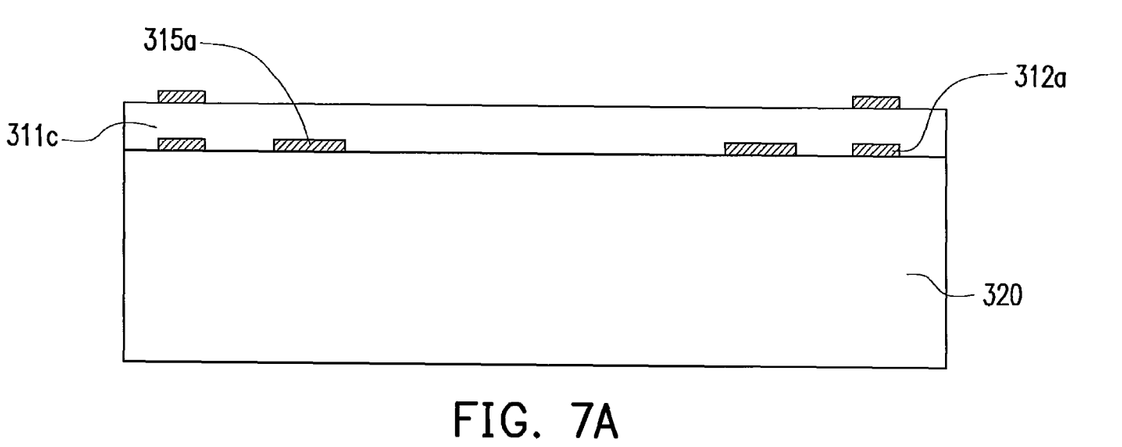
FIGS. 7A to 7C are cross-sectional views schematically showing a fabricating process of the interposer structure shown in FIG. 5B.
Figure 7B:
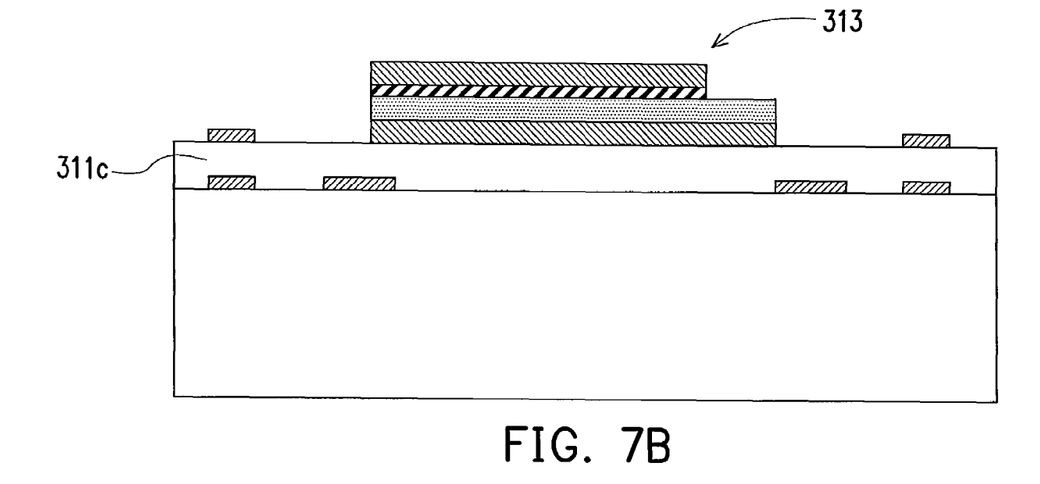
Figure 7C:
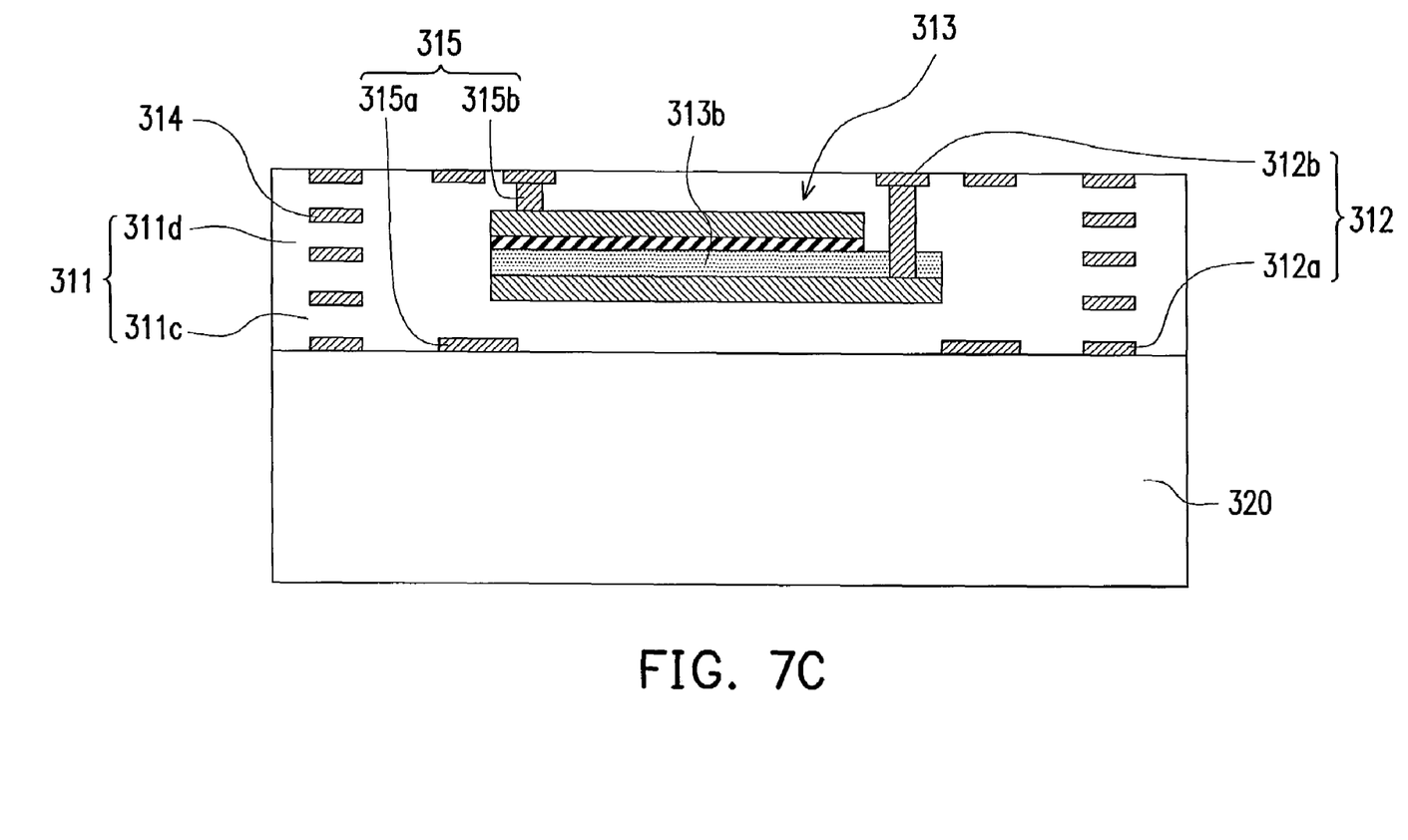

FIGS. 7A to 7C are cross-sectional views schematically showing a fabricating process of the interposer structure 310 shown in FIG. 5B, which includes the following sub-steps. First, referring to FIG. 7A, a plurality of first sub-contacts 312a, a first sub-dielectric layer 311c, and a first sub-interconnection 315a are formed on the first electronic component 320, wherein the first electronic component 320 is electrically connected to the first sub-interconnection 315a through the first sub-contacts 312a. The first sub-contacts 312a are disposed between the first sub-dielectric layer 311c and the first electronic component 320 and the first sub-interconnection 315a is disposed on and in the first sub-dielectric layer 311c. (Not shown)

Next, referring to FIG. 7B, the capacitive element 313 is disposed onto the first sub-dielectric layer 311c. Then, an etching process is performed on the capacitive element 313 to define the capacitor surface area.

As shown in FIG. 7C, a plurality of second sub-contacts 312b, a second sub-dielectric layer 311d, a second sub-interconnection 315b and a inductive element 314 are formed on the first sub-dielectric layer 311c through the build-up process, wherein the capacitive element 313 and the inductive element 314 are embedded into the second sub-dielectric layer 311d. The second sub-contacts 312b are disposed on the second sub-dielectric layer 311d. The second sub-interconnection 315b are embedded into the second sub-dielectric layer 311d and electrically connected to the first sub-interconnection 315a. The first sub-dielectric layer 311c and the second sub-dielectric layer 311d compose a first dielectric layer 311. The first sub-interconnection 315a and the second sub-interconnection 315b compose an interconnection 315. The first sub-contacts 312a and the second sub-contacts 312b compose the contacts 312. The capacitive element 313 and the inductive element 314 are electrically connected to the corresponding contacts 312 through the interconnection 315 respectively. It should be noted that the permittivity of the first dielectric layer 311 can be smaller than that of the second dielectric layer 313b of the capacitive element 313 and the inductive element 314 may be disposed surrounding the capacitive element 313.

Then, referring to FIGS. 4 and 5C, step S030 is carried out to dispose a second electronic component 330 on the first dielectric layer 311 and electrically connect the second electronic component to the corresponding contacts 312. To be more specific, the second electronic component 330 is disposed on the second sub-dielectric layer 311d through the flip chip bonding technology and electrically connected to the second sub-contacts 312b.

Figure 8:
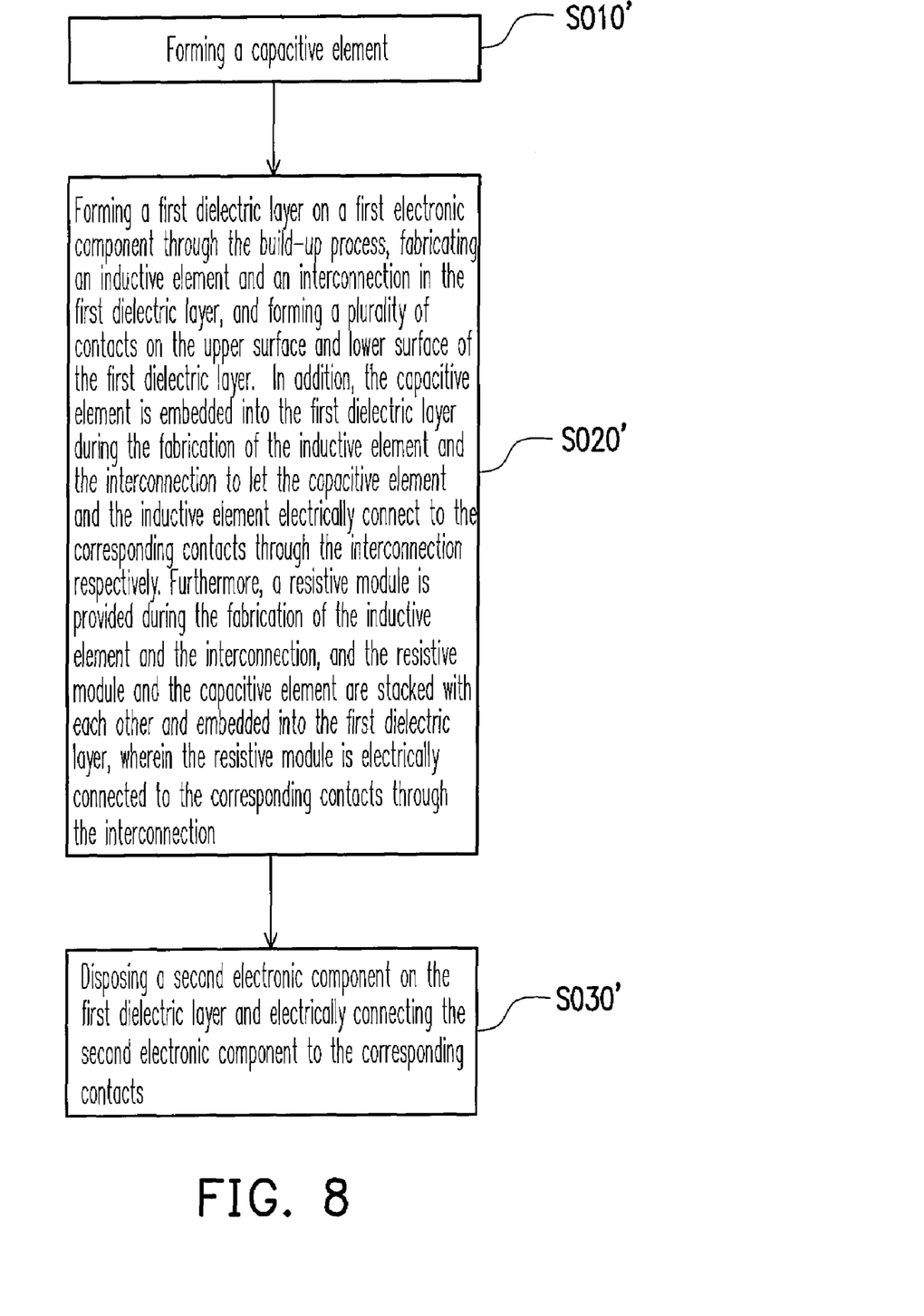
FIG. 8 is a flow chart illustrating a fabricating method of a packaging structure according to another embodiment of the present invention.
Figure 9:
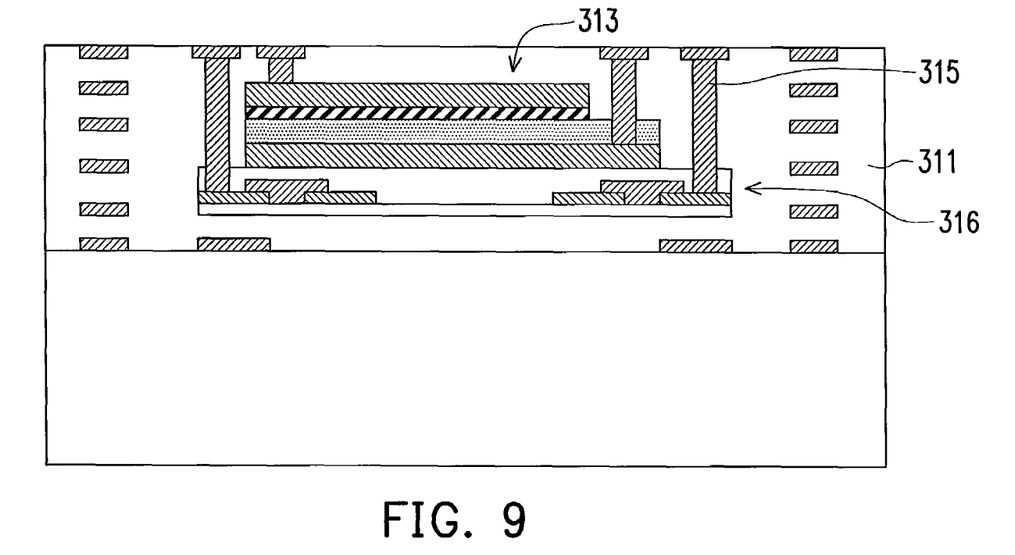
FIG. 9 is a cross-sectional view schematically illustrating the steps S020' shown in FIG. 8.

A fabricating method of a packaging structure of another embodiment of the present invention is illustrated in detail as follows. Referring to FIGS. 4, 8 and 9, wherein FIG. 8 is a flow chart illustrating a fabricating method of a packaging structure according to another embodiment of the present invention, and FIG. 9 is a cross-sectional view schematically illustrating the steps S020' shown in FIG. 8. The fabricating method of the packaging structure of the present embodiment includes the steps S010', S020' and S030', wherein the steps S010' and S030' are identical with the steps S010 and S030, thus the detail is omitted herein.

The difference between the present embodiment and the above embodiment of the packaging structure fabricating method is that: the present embodiment further provides a resistive module 316 at the step S020' during the fabrication of the inductive element 314 and the interconnection 315, and makes the resistive module 316 and the capacitive element 313 stack up with each other in order to be embedded into the first dielectric layer 311, wherein the resistive module 316 is electrically connected to the corresponding contacts 312 through the interconnection 315. It should be noted that the above mentioned method of stacking up the resistive module 316 with the capacitive element 313 and to be embedded into the first dielectric layer 311, is performed by first to stack up the capacitive element 313 and the resistive module 316 and then embedded them into the first dielectric layer 311.

Figure 10A:
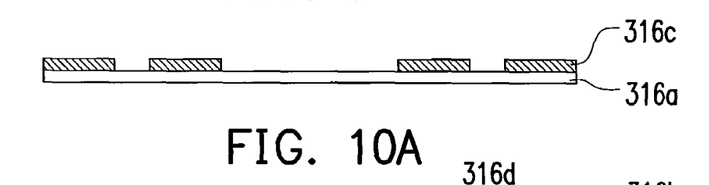
FIGS. 10A to 10B are cross-sectional views schematically showing a fabricating process of the resistive module shown in FIG. 9.
Figure 10B:
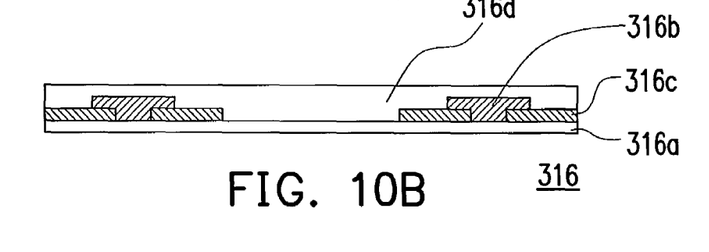

FIGS. 10A to 10B are cross-sectional views schematically showing a fabricating process of the resistive module shown in FIG. 9. The fabricating process of the resistive module 316 includes the following sub-steps. First, referring to FIG. 10A, a substrate 316a is provided. Then, plural electrodes 316c are formed on the substrate 316a. Next, referring to FIG. 10B, a resistive thin film 316b is formed on the substrate 316a and electrically connected to the electrodes 316c. Then, a passivation layer 316d is formed on the substrate 316a to cover the electrodes 316c and the resistive thin film 316b. Furthermore, according to needs, the substrate 316a can be thinned out to make the thickness of the resistive module 316 complied with the design requirements after the above steps.

Figure 11:
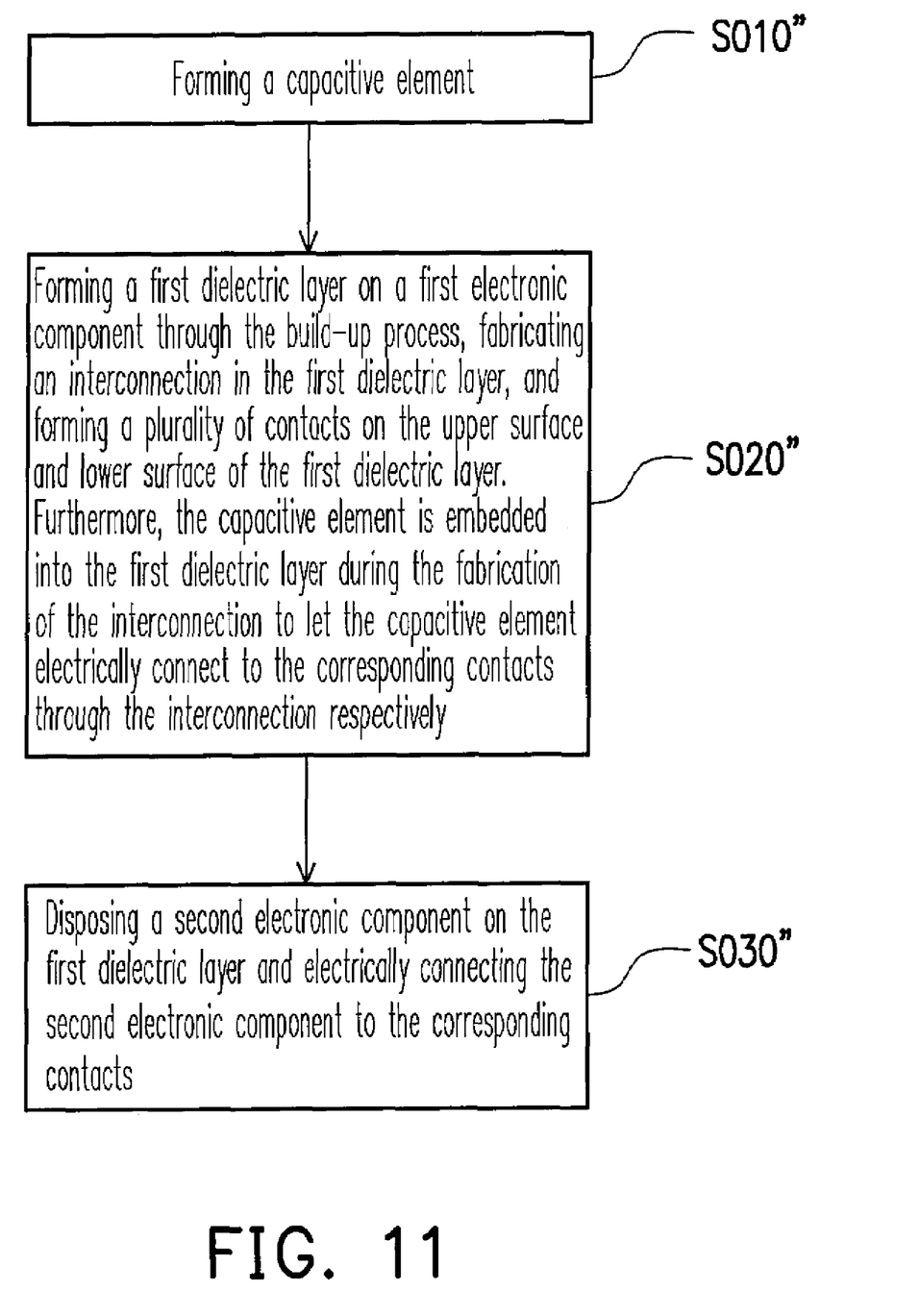
FIG. 11 is a flow chart illustrating a fabricating method of a packaging structure according to another embodiment of the present invention.
Figure 12:
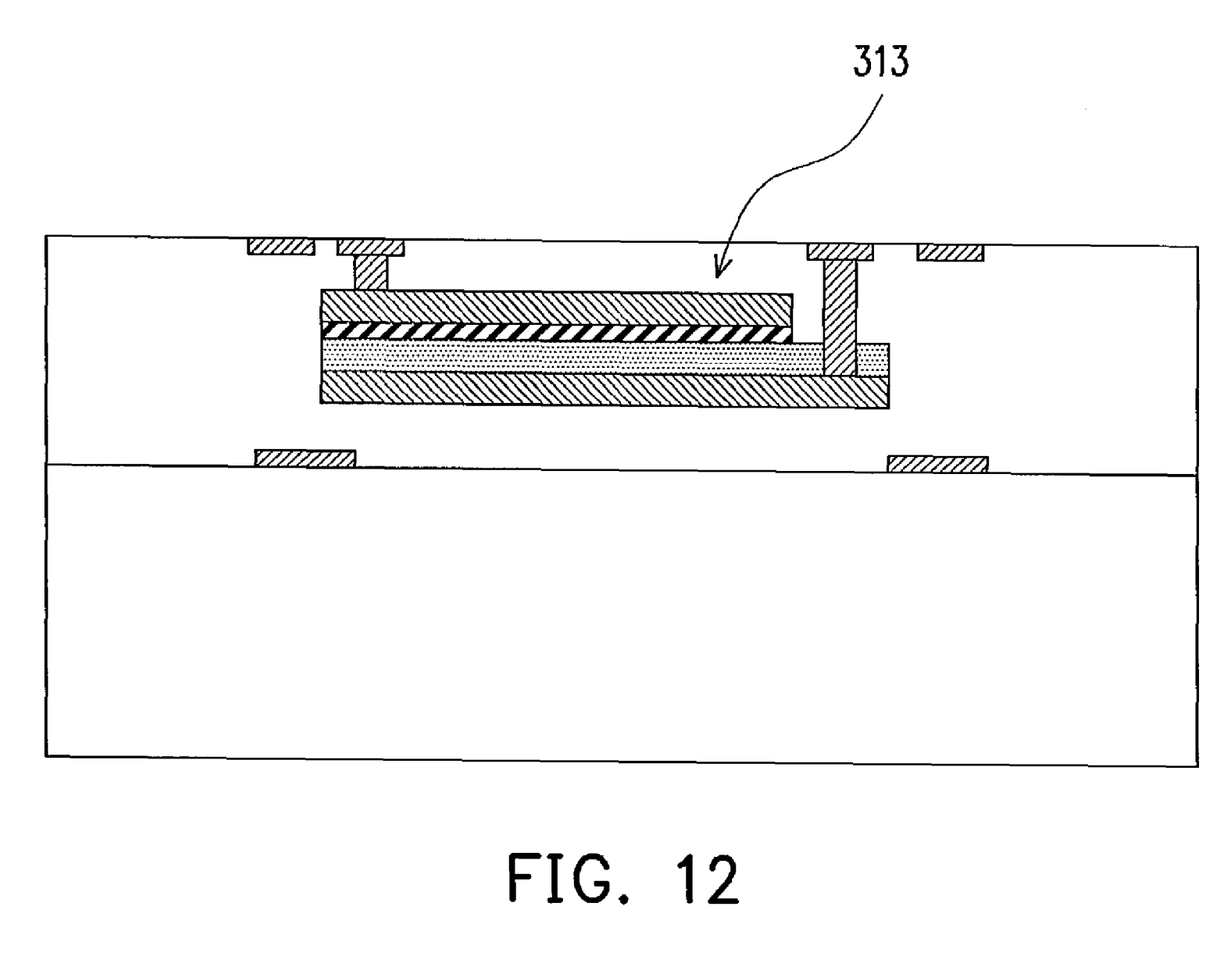
FIG. 12 is a cross-sectional view schematically showing the steps S020'' shown in FIG. 11.

A fabricating method of a packaging structure of another embodiment of the present invention is illustrated in detail as follows. Referring to FIGS. 4, 11 and 12, FIG. 11 is a flow chart illustrating a fabricating method of a packaging structure according to another embodiment of the present invention. And the FIG. 12 is a cross-sectional view schematically illustrating the steps S020" shown in FIG. 11. The fabricating method of the packaging structure of the present embodiment includes the steps S010", S020" and S030", wherein the steps S010" and S030" are identical with the steps S010 and S030, thus the detail is omitted herein.

The difference between the present embodiment and the above embodiment of the packaging structure fabricating method is that: the present embodiment of the packaging structure only embeds one passive element, the capacitive element 313, into the first dielectric layer 311 at the step S020".

In summary, the packaging structure and the fabricating method thereof have at least the following advantages:
1. Since the interposer structure of the present invention does not contain semiconductor substrates, the interposer structure is thinner and smaller in size.
2. Because the capacitive element is located closer to either the first electronic component or the second electronic component, the efficiency is improved when the capacitive element is served as a de-coupling capacitor.
3. The permittivity of the second dielectric layer is higher to attain a higher capacitance. On the other hand, since the permittivity of the first dielectric layer is lower, the parasitic capacitance value of the inductive element is lower and thus has a better Q-factor.
4. The spiral-like inductive element can be disposed surrounding the capacitive element to achieve a high integration density of the passive element of the interposer structure. In addition, the thickness and the size of the interposer structure can be reduced.
5. The capacitive element can be manufactured individually first, and then be embedded into the first dielectric layer. Therefore, the fabricating method of the present invention can be integrated with the conventional process to decrease the manufacturing cost.

6. The capacitive element and the resistive module can be manufactured individually first, and then be stacked to each other and embedded into the first dielectric layer. Therefore, the fabricating method of the present invention can be integrated with the conventional process to decrease the manufacturing cost.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A packaging structure, comprising:
    an interposer structure, including:
        a first dielectric layer;
        a plurality of contacts, which are disposed on the upper and lower surfaces of the first dielectric layer;
        a capacitive element, which is embedded into the first dielectric layer and the capacitive element comprises two conductive layers and a second dielectric layer among them;
        an interconnection, which is embedded into the first dielectric layer and the capacitive element electrically connects to the corresponding contacts through the interconnection;
        an inductive element, embedded into the first dielectric layer and disposed surrounding the capacitive element; and
        a resistive module, embedded into the first dielectric layer and stacked up with the capacitive element, wherein the resistive module is electrically connected to the corresponding contacts through the interconnection, the resistive module comprising:
            a substrate;
            a resistive thin film, disposed on the substrate and electrically connected to the interconnection;
            a plurality of electrodes, disposed on the substrate, the resistive thin film being connected to the interconnection through the electrodes; and
            a passivation layer, disposed on the substrate and covering the resistive thin film and the electrodes,
        wherein the capacitive element, the inductive element, and the resistive module are encapsulated within the first dielectric layer.

2. The packaging structure as described in claim 1, wherein the permittivity of the first dielectric layer is smaller than that of the second dielectric layer.

3. The packaging structure as described in claim 1, wherein the capacitive element further includes a barrier layer, which is disposed between one of the conductive layers and the second dielectric layer.

4. The packaging structure as described in claim 3, wherein the material of the barrier layer includes titanium (Ti), platinum (Pt), or silver (Ag).

5. The packaging structure as described in claim 1, wherein the material of the second dielectric layer includes ceramic.

6. The packaging structure as described in claim 5, wherein the material of the second dielectric layer includes barium titanate (BaTiO3) or strontium titanate (SrTiO3).

7. The packaging structure as described in claim 1, wherein the material of the first dielectric layer includes benzocyclobutene (BCB) or polyimide (PI).

8. The packaging structure as described in claim 1, wherein the material of the substrate is ceramic.

9. The packaging structure as described in claim 1, wherein the first electronic component is a semiconductor chip or a wafer.

10. The packaging structure as described in claim 1, wherein the second electronic component is a semiconductor chip or a wafer.

11. The packaging structure as described in claim 1, wherein the material of the first dielectric layer comprises polymer, the material of the second dielectric layer comprises ferroelectric material, and the second dielectric layer is encapsulated within the first dielectric layer.

12. The packaging structure as described in claim 1, further including a first electronic component and a second electronic component, which are electrically connected to the corresponding contacts and respectively disposed on the upper and lower sides of the interposer structure.

* * * * *